(12) United States Patent
Vatteroni et al.

(10) Patent No.: US 11,184,568 B2
(45) Date of Patent: Nov. 23, 2021

(54) PIXEL CHARGE CONTROL CIRCUIT IN DIGITAL DEVICES FOR IMAGES ACQUISITION

(71) Applicant: EYE-TECH S.R.L., Malè (IT)

(72) Inventors: Monica Vatteroni, Malè (IT); Carmela Cavallotti, Malè (IT); Alessandro Caleo, Malè (IT)

(73) Assignee: EYE-TECH S.R.L., Malè (IT)

( * ) Notice: Subject to any disclaimer, the term of this patent is extended or adjusted under 35 U.S.C. 154(b) by 166 days.

(21) Appl. No.: 16/619,726

(22) PCT Filed: Jun. 12, 2018

(86) PCT No.: PCT/IB2018/054231
§ 371 (c)(1),
(2) Date: Dec. 5, 2019

(87) PCT Pub. No.: WO2018/229645
PCT Pub. Date: Dec. 20, 2018

(65) Prior Publication Data
US 2020/0204752 A1   Jun. 25, 2020

(30) Foreign Application Priority Data
Jun. 14, 2017   (IT) .................. 102017000066147

(51) Int. Cl.
*H04N 5/374* (2011.01)
*H04N 5/355* (2011.01)
(Continued)

(52) U.S. Cl.
CPC ..... *H04N 5/3741* (2013.01); *H01L 27/14603* (2013.01); *H01L 27/14612* (2013.01);
(Continued)

(58) Field of Classification Search
CPC .. H04N 5/3741; H04N 5/3559; H04N 5/3591; H04N 5/3745; H04N 5/3742; H01L 27/14603; H01L 27/14612
See application file for complete search history.

(56) References Cited

U.S. PATENT DOCUMENTS

| 6,469,740 B1 | 10/2002 | Kuroda et al. |
| 2007/0146519 A1 | 6/2007 | Iwasawa |

(Continued)

FOREIGN PATENT DOCUMENTS

| KR | 20110138968 | 12/2011 |
| KR | 20110138969 | 12/2011 |
| WO | 9943153 | 8/1999 |

OTHER PUBLICATIONS

Machine Translation of KR20110138968.
(Continued)

*Primary Examiner* — Abdelaaziz Tissire
(74) *Attorney, Agent, or Firm* — Preston Smirman; Smirman IP Law, PLLC (57) ABSTRACT

A digital device for image acquisition (10) comprises at least one selection decoder circuit (60) and a plurality of sub-blocks (50) each comprising one or more pixels (20) and a corresponding charge control circuit (30) which provides a circuit suitable for realizing a logic port of the AND type (31) having a selector input terminal (34) which receives the selection signal from the selection decoder circuit (60) and a suitable enabling input terminal (35) to receive an enabling signal; and interruption organs (32) connected to the reset terminal (21) of the pixel (20) to transmit a reset signal constituted alternatively by a signal output from the aforesaid circuit suitable for realizing a logic port of the AND type (31) or from a global reset signal transmitted to a corresponding global reset terminal (38). The reset signal of a sub-block can be controlled directly by the selection (Continued)

decoder (60), while the global signal transmitted to the global reset terminal (38) may be a digital signal suitable for performing a global reset of all the pixels of the device; it can be an analog global signal of the type suitable to limit the blooming effect or to obtain high dynamics.

10 Claims, 8 Drawing Sheets (51) Int. Cl.
H04N 5/359 (2011.01)
H01L 27/146 (2006.01)
H04N 5/3745 (2011.01)

(52) U.S. Cl.
CPC ......... H04N 5/3559 (2013.01); H04N 5/3591 (2013.01); H04N 5/3745 (2013.01)

(56) References Cited

U.S. PATENT DOCUMENTS

| | | | | |
|---|---|---|---|---|
| 2007/0165123 A1* | 7/2007 | Panicacci | ............... | H04N 5/341 348/294 |
| 2008/0088724 A1* | 4/2008 | Kudoh | ................. | H04N 5/3741 348/300 |
| 2009/0086077 A1* | 4/2009 | Wada | ..................... | H04N 5/345 348/308 |
| 2009/0244344 A1* | 10/2009 | Takayanagi | .......... | H04N 3/1568 348/308 |
| 2011/0062310 A1* | 3/2011 | Kudo | ................... | H04N 5/2176 250/208.1 |
| 2017/0125464 A1* | 5/2017 | Abe | ...................... | H04N 5/3741 |
| 2021/0109153 A1* | 4/2021 | Waayers | ............... | G06F 30/333 |

OTHER PUBLICATIONS

Machine Translation of KR20110138969.
International Search Report dated Sep. 28, 2018.
Written Opinion of International Searching Authority dated Sep. 28, 2018.
International Preliminary Report on Patentability dated Dec. 17, 2019.

* cited by examiner

PIXEL CHARGE CONTROL CIRCUIT IN DIGITAL DEVICES FOR IMAGES ACQUISITION

CROSS-REFERENCE TO RELATED APPLICATION

The instant application is a national phase of PCT International Application No. PCT/IB2018/054231, filed Jun. 12, 2018, and claims priority to Italian Patent Application Serial No. 102017000066147, filed Jun. 14, 2017, the entire specification of both of which are expressly incorporated herein by reference.

TECHNICAL FIELD

The present invention relates to a digital device for image acquisition of the type comprising at least one selection decoder and a plurality of image sensors each comprising a reset circuit and one or more pixels, each provided with at least one photosensor and reset, selection and reading terminals to allow, respectively, the photo sensor discharge, the pixel selection to enable the reading and the reading itself, in which the selection terminal is connected to the aforementioned selection decoder.

STATE OF THE ART

Typically, the pixels arranged to form a array inside a digital device for image acquisition are addressed, to enable reading thereof, by means of circuits known as line decoders and column decoders.

The reset, or download, of the pixels is instead typically performed by rows using a third specific decoder for the reset operation.

This entails a useless waste of space and power because the selection and reset operations do not necessarily need to be independent one from the other, since the selected line is typically reset at the end of the reading.

It is therefore desirable to use a single line decoder to perform both the selection of a row of pixels and their subsequent reset in a mutually dependent mode.

A partial solution to the aforementioned problem has been proposed in the patent document WO9943153 which presents an architecture for selecting and resetting the rows in which a dedicated reset decoder and a dedicated selection decoder are still present. The two distinct outputs are combined within a cell that produces a unique signal used both for selecting a line and for generating a reset for the previously read line. The aforesaid architecture is advantageous because along the array run half of the transmission lines of the signals that serve conventionally, however this is obtained at the expense of a complication of the control logic and, as already highlighted, remains the presence of two distinct decoders for selection and for reset.

Another partial solution to the double decoder problem is proposed in the patent document KR20110138969 which shows an architecture in which only the selection decoder is present and the reset signal is generated starting from the selection signal via a circuit logic that produces an AND operation between the selection signal and a global reset signal common to the whole array. This architecture eliminates the need for a dedicated reset decoder but it does not allow a global reset of the whole pixel array. Furthermore, being a purely digital architecture, it does not allow to act on the blooming effect neither on the dynamics of the sensor.

SUMMARY OF THE INVENTION

The object of the present invention is therefore to propose a device for the acquisition of digital images in which the presence of a dedicated decoder for line reset is eliminated, with an alternative architecture with respect to the prior art.

Another object of the present invention is to propose a digital device for image acquisition in which the row reset is performed depending on the row selection and also allows a global reset of the whole array.

Another object of the invention is to propose a digital device for image acquisition in which a reset circuit can drive the line reset depending on a selection signal and which at the same time allows to avoid the blooming effect and to manage the dynamics of the pixels by transmitting analog discharge signals.

Another object of the invention is to use a further transistor to separate the photodiode output from the input of the voltage decoupling buffer and from the reset transistor. This transistor will be advantageously driven by a static or dynamic analog voltage in order to influence the pixel sensitivity in a dynamic manner.

Conventionally, an image acquisition device comprises at least one selection decoder circuit, and a plurality of image sensors each comprising a charge control element, and one or more detection and conversion elements, each provided with at least one photosensor and a photo sensor discharge element controllable by a corresponding reset terminal from the aforesaid charge control circuit and in which each of the detection and conversion elements is able to convert the current generated by the relative photosensor into a voltage signal available at a reading terminal on command of a selection switch controlled by a selection terminal from a selection signal of the selection decoder circuit.

According to a peculiar aspect of the present invention, the charge control circuit comprises: a circuit suitable for realizing a logic port of the AND type having a first input terminal which receives said selection signal of said selection decoder circuit and a second input terminal suitable for receiving a first control signal common to all detection and conversion elements of the device; and interruption organs connected to said reset terminal to transmit a reset signal constituted alternatively by an output control signal from said circuit suitable for realizing a logic port of the AND type or by a second control signal.

Thanks to the architecture outlined above it is possible to generate both a line signal independent from the signal of the other lines and generated starting from the signal state of the selection decoder and a reset signal common to the whole array through the interruption organs that can selectively enable either the signal from the AND port or the second control signal.

Advantageously, the interruption organs comprise two interruption elements, of which a first interruption element is driven by a third control signal and a second interruption element driven by the denied complementary of said third control signal.

Since the two switches are driven by a third signal and by its denied complementary, it is prevented that the signal coming from the AND circuit and the second control signal can overlap.

Advantageously, the circuit suitable for realizing a logic port of the AND type is an analog circuit having a minimum reference voltage value greater than zero. This solution avoids, for example, blooming, imposing a minimum voltage greater than zero.

Still advantageously, the digital device for image acquisition comprises analog signal generating organs for generating the second control signal. Since the array global reset signal is an analog signal, this can be adapted either to limit blooming (by imposing a minimum voltage other than zero and permitting a correct operation of the buffer transistor in the pixel), and to make the pixel discharge in a controlled manner by the application of a ramp control signal or other equivalent ones, thus allowing to obtain a high signal dynamics at the output of the pixel.

In an advantageous variant embodiment, the device comprises an auxiliary charge control circuit interposed between the interruption organs and the reset terminal, and the aforesaid auxiliary control circuit is suitable for receiving the reset signal and for alternatively transmitting a reset signal or an external reference signal depending on the reset signal. The external reference signal can be dynamically programmed depending on the response of the pixel to be obtained and on the dynamics of light to be represented within the same image. This, in fact, can be a constant signal or a ramp signal or something else. The presence of the auxiliary circuit allows obtaining the high dynamics and the anti-blooming even when the second control signal and the AND logic circuit are purely digital. The auxiliary circuit can drive the photo sensor discharge element of any standard three or four transistor linear pixel as well as a pinned photodiode or any other detection and conversion element structure.

Conventionally, in the four-transistor or pinned photodiode or similar pixel structures, the fourth transistor is digitally used by separating the photodiode output from the input of the voltage decoupling buffer and from the reset transistor. Therefore, it is possible to freeze the pixel information at the input of the photosensor and make a further discharge of the photodiode on the output signal irrelevant.

Still advantageously, according to the present invention, said fourth transistor can be controlled in an analogical manner, with both a static and a dynamic voltage, influencing the pixel's sensitivity. In fact, the pixel's sensitivity increases with the decreasing of the driving voltage of the fourth transistor, which affects the charge storage capacity of the pixel by decreasing the dynamics of the signal but increasing the sensitivity.

Still advantageously, the combination of sensitivity control via the fourth transistor and the dynamics, through the reset terminal, allows to obtain a wide combination of output signals with different sensitivity and dynamics.

BRIEF DESCRIPTION OF THE DRAWINGS

These and other advantages and characteristics associated with the device of the present invention will, moreover, be more easily understood by the illustration of an exemplary embodiment, as described below with the aid of the attached drawings, in which:

FIG. 4 shows possible combinations of selection and reset signals to be applied to a device according to the present invention: FIG. 4a refers to the embodiment of FIG. 2, FIG. 4b refers to the embodiment of FIG. 3;

DESCRIPTION OF THE PREFERRED EMBODIMENTS

Figure 1:
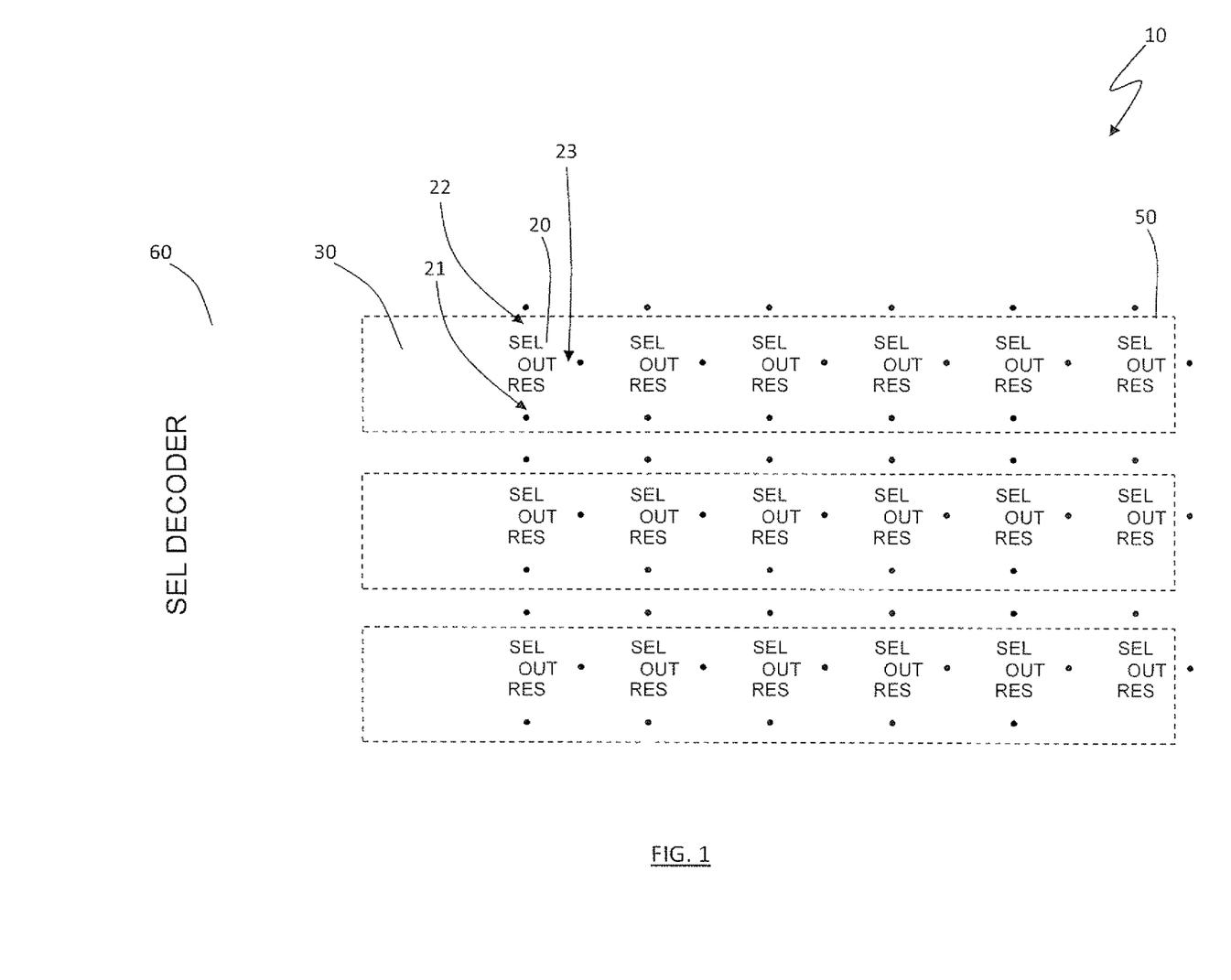
FIG. 1 shows a configuration of a digital device for image acquisition according to the present invention.

With reference to FIG. 1, a digital device for image acquisition, 10, according to the present invention comprises a plurality of detection and conversion elements, 20, or pixels, arranged in rows and columns to form a array.

Each pixel 20 has, as will be described in more detail below, at least one reset terminal, 21, a selection terminal, 22, and a reading terminal, 23. The reset terminal 21 is connected to a charge control circuit, 30. A plurality of pixels 20 arranged on a row are connected to a same circuit for controlling the charge 30 and together form a sub-block of an image sensor 50. The device 10 comprises a plurality of sub-blocks of an image sensor 50, each constituting a line of pixels 20. A selection decoder circuit 60 is connected to the selection terminal 22 of each pixel of each sub-block of the image sensor 50 for transmitting row selection signals generated therefrom. The same selection signal is also transmitted in input to the charge control circuit 30, according to modes which will be described in more detail below, to control the charge of each pixel 20 by means of a reset signal transmitted from the charge control circuit to the reset terminal 21 of each pixel 20. Therefore, the row reset signal does not require the presence of a dedicated reset decoder but it is provided to the pixels 20 of the row depending on the selection signal.

Figure 2:
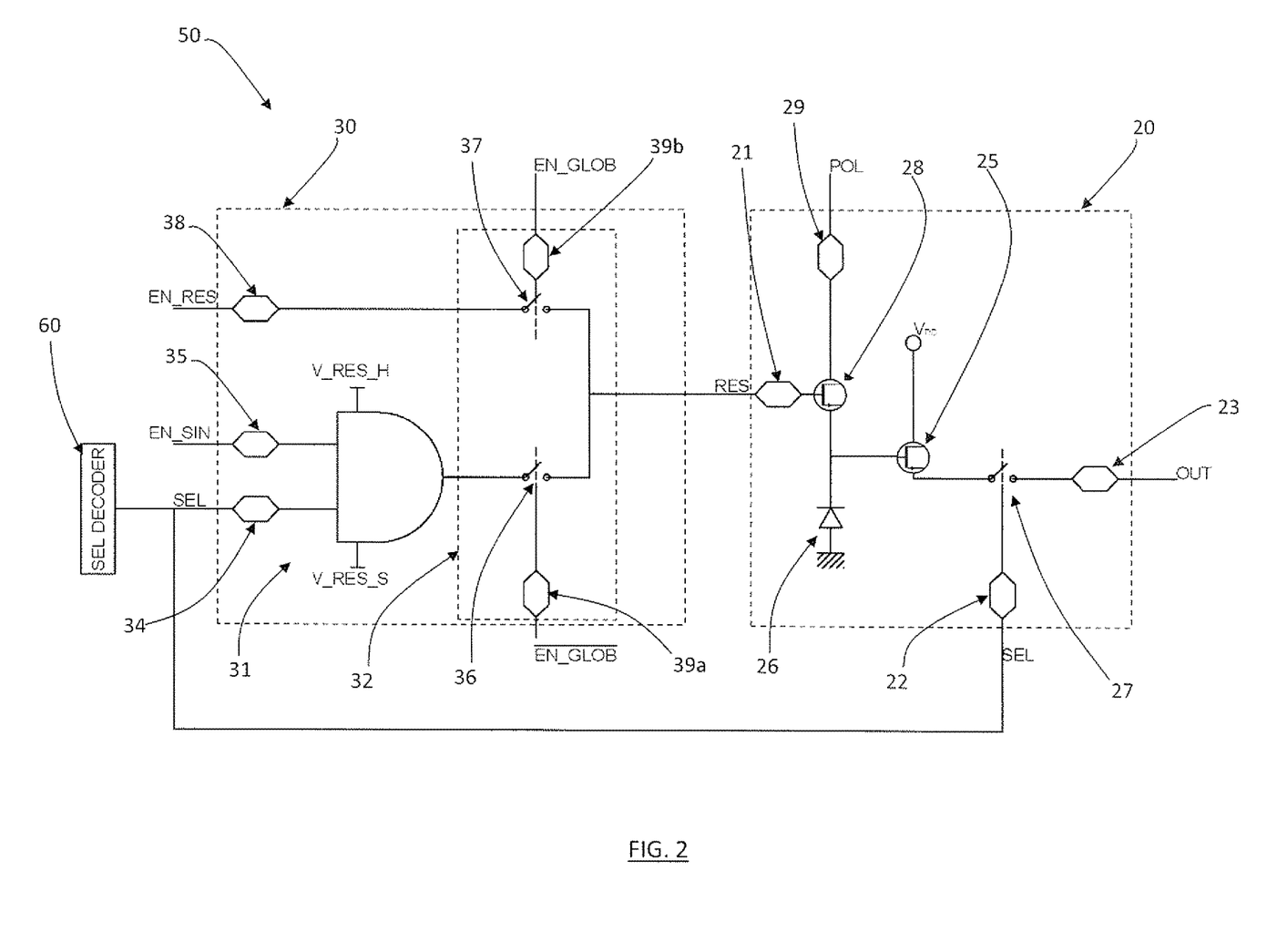
FIG. 2 shows an electric diagram of a first embodiment of a sub-block of an image sensor in a device according to the present invention.

With reference to FIG. 2, an advantageous embodiment of a sub-block of an image sensor 50 according to the present invention provides a detection and conversion element 20 of known technology provided with:
a photosensor, 26;
a reset element of the photosensor 28, such as for example a MOS transistor, polarized through an external polarization signal connected to a polarization terminal 29, and driven by a reset signal via the reset terminal 21;
a decoupling signal element, 25, and
a switch, 27, driven by the selection terminal 22 and suitable for enabling the transmission of the output signal to the reading terminal, 23.

The configuration shown and above described of the detection and conversion element 20 is that of an integrating standard linear pixel which includes N-type transistors, however in different embodiments the element 20 can be configured to accommodate transistors of the P type or have an architecture of a different type such as, for example, that of the pinned photodiode or any other architecture known to the state of the art.

The reset terminal 21 is connected to the output of the charge control circuit 30, which comprises a circuit suitable for realizing a logic port of the AND type, 31, and interruption organs, 32.

The circuit suitable for realizing a logic port of the AND type 31 has a selector input terminal 34, deriving from the selection decoder circuit 60, and an enabling input terminal 35, suitable for receiving an enabling signal common to all pixels 20 of the device 10.

The interruption organs 32 comprise a first interruption element 36, interposed between the output of the circuit suitable for making a logic port of the AND type 31 and the reset terminal 21 and a second interruption element, 37, interposed between a global reset terminal, 38, suitable for receiving a global reset signal common to the whole array of pixels 20, and the reset terminal itself 21. The first interruption element 36 is driven by a control signal transmitted to a first control terminal 39a, and the second interruption element 37 is driven by the denied complementary of the same control signal transmitted to a relative second control terminal, 39b. In this way, the interruption organs 32 ensure that at the reset terminal 21 arrives either the output signal from the circuit suitable for realizing a logic port of the AND type 31 or the global reset signal, avoiding possible overlaps between the two signals. In an alternative embodiment, the driving of the first interruption element 36 and of the second interruption element 37 is carried out by means of two distinct control signals, with the overlap between the signals leaving the AND logic port 31 and the global reset signal which is avoided by different control organs.

Figure 5:
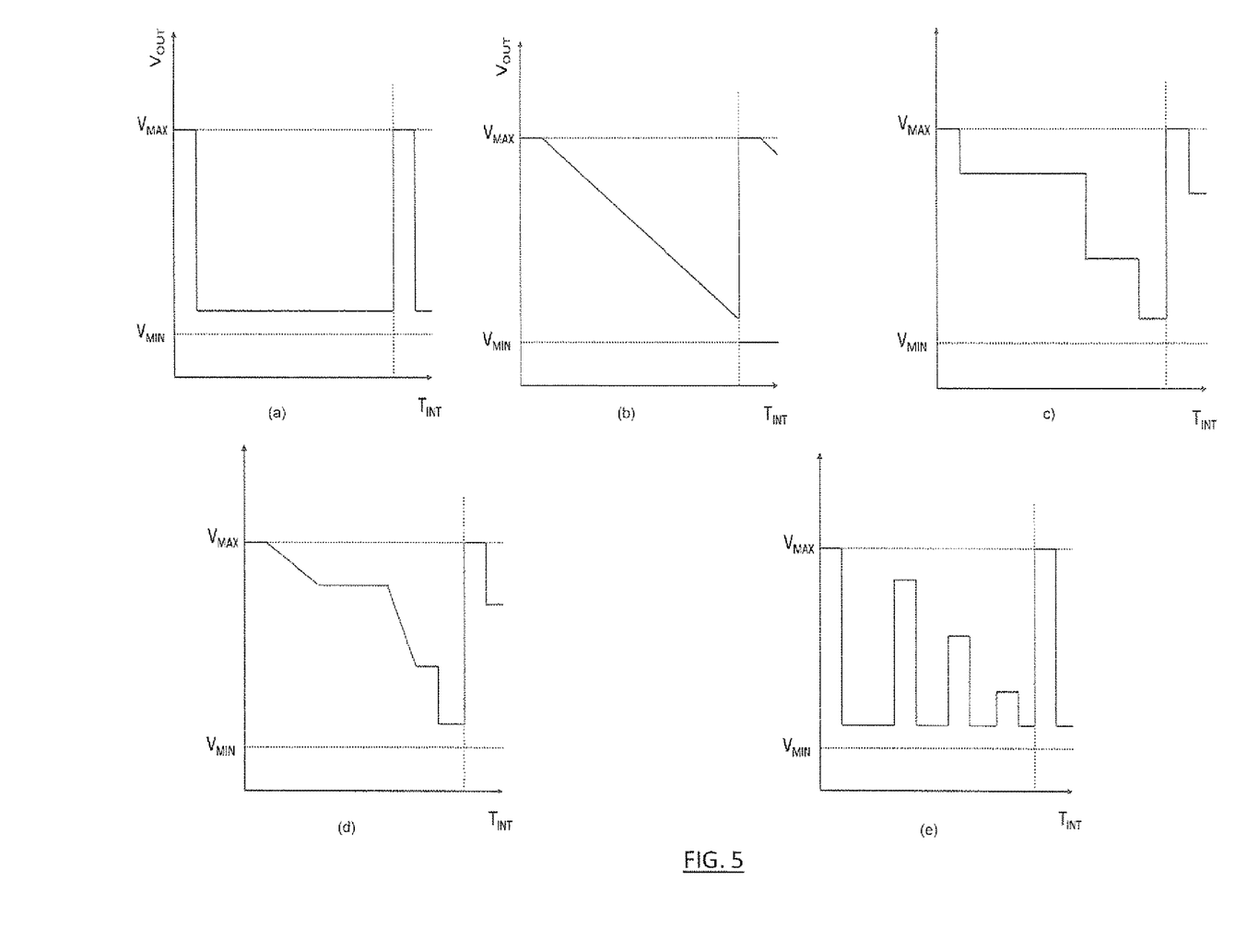
FIG. 5 shows types of reset signals which can be applied to at least one input terminal in a device according to the present invention.

The charge control circuit 30 allows to generate both a line reset signal independent from the signal of the other lines and generated starting from the selection signal of the line sent by the selection decoder circuit 60, and to enable a global reset signal of the array of pixels 20 transmitted to the global reset terminal 38 and enabled by the control signal 39. In this embodiment, the global reset signal 38 is preferably an analog signal which can be adapted to simultaneously reset all the pixels 20, to limit the blooming (by imposing a minimum voltage different from zero and such as to allow a correct operation of the buffer transistor of the pixel 20), to download the pixel 20 in a controlled manner through the application of a programmed control signal. With reference to FIG. 5, a programmed control signal is advantageously selected from a constant signal (FIG. 5a), in order to obtain a standard linear dynamic, a ramp (FIG. 5b), steps (FIG. 5c), a broken line (FIG. 5d), may be composed of reset bursts (FIG. 5e), or may have other forms. By applying a programmed control signal as specified above, a high signal dynamics can be obtained at the output of the pixel 20. Moreover, the blooming effect can be avoided even if it is not performed a global reset but a row reset since the circuit suitable for realizing a logic port of the AND type 31 can be of the analog type and it is therefore possible to have maximum and minimum reference values different from power supply and ground, respectively, but with a different analog values. Therefore, the blooming effect is avoided by imposing a minimum voltage higher than zero.

Figure 2B:
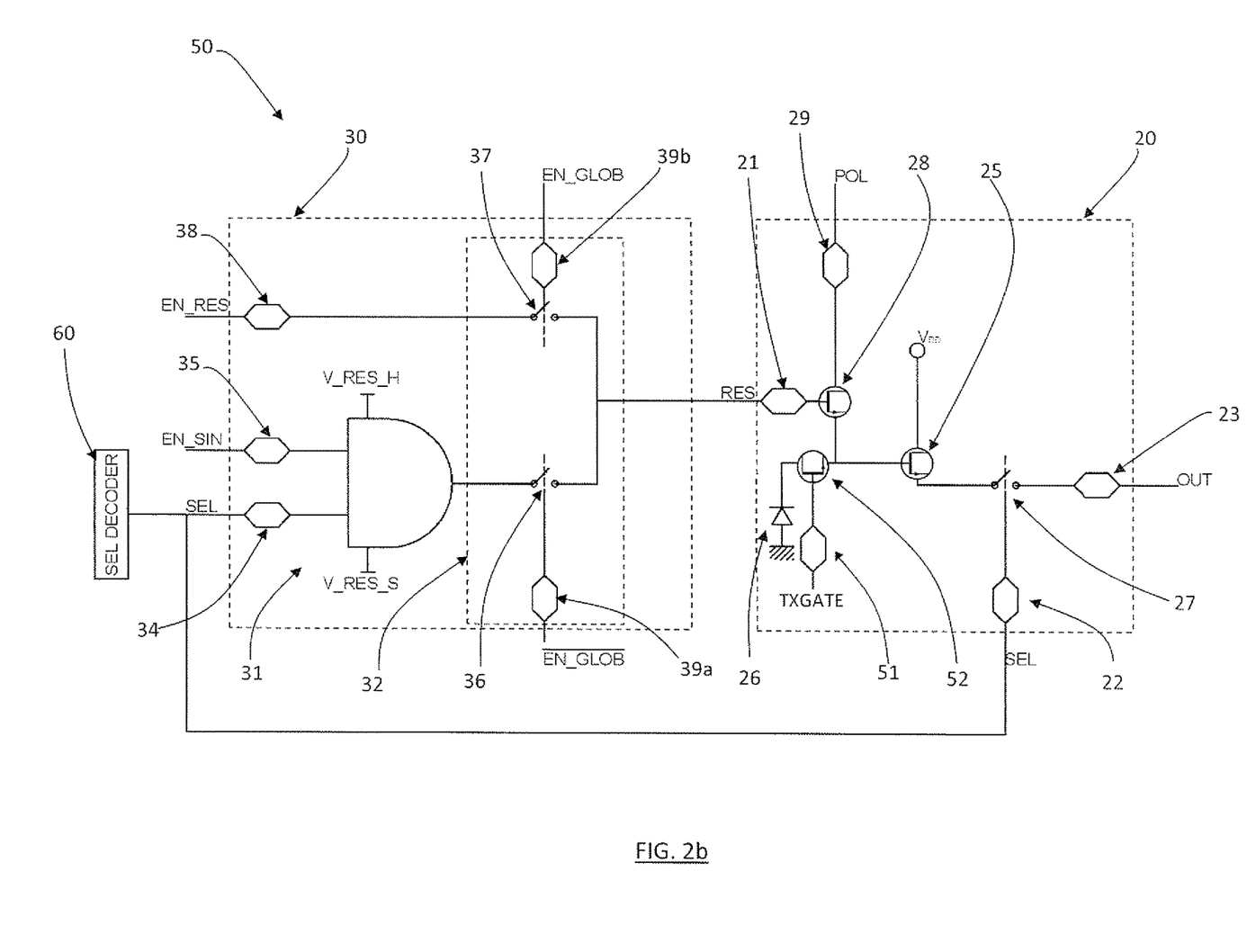
FIG. 2b shows an electrical diagram of a second embodiment of a sub-block of an image sensor in a device according to the present invention.

In an alternative embodiment, shown in FIG. 2b, a fourth transistor 52 is added to the pixel 20. This transistor is controlled by the analog TXGATE signal applied to the terminal 51. The analog TXGATE signal can be either static or dynamic. When the analog voltage applied to the terminal 51 changes, both the sensitivity of the pixel and its dynamics change.

Figure 3:
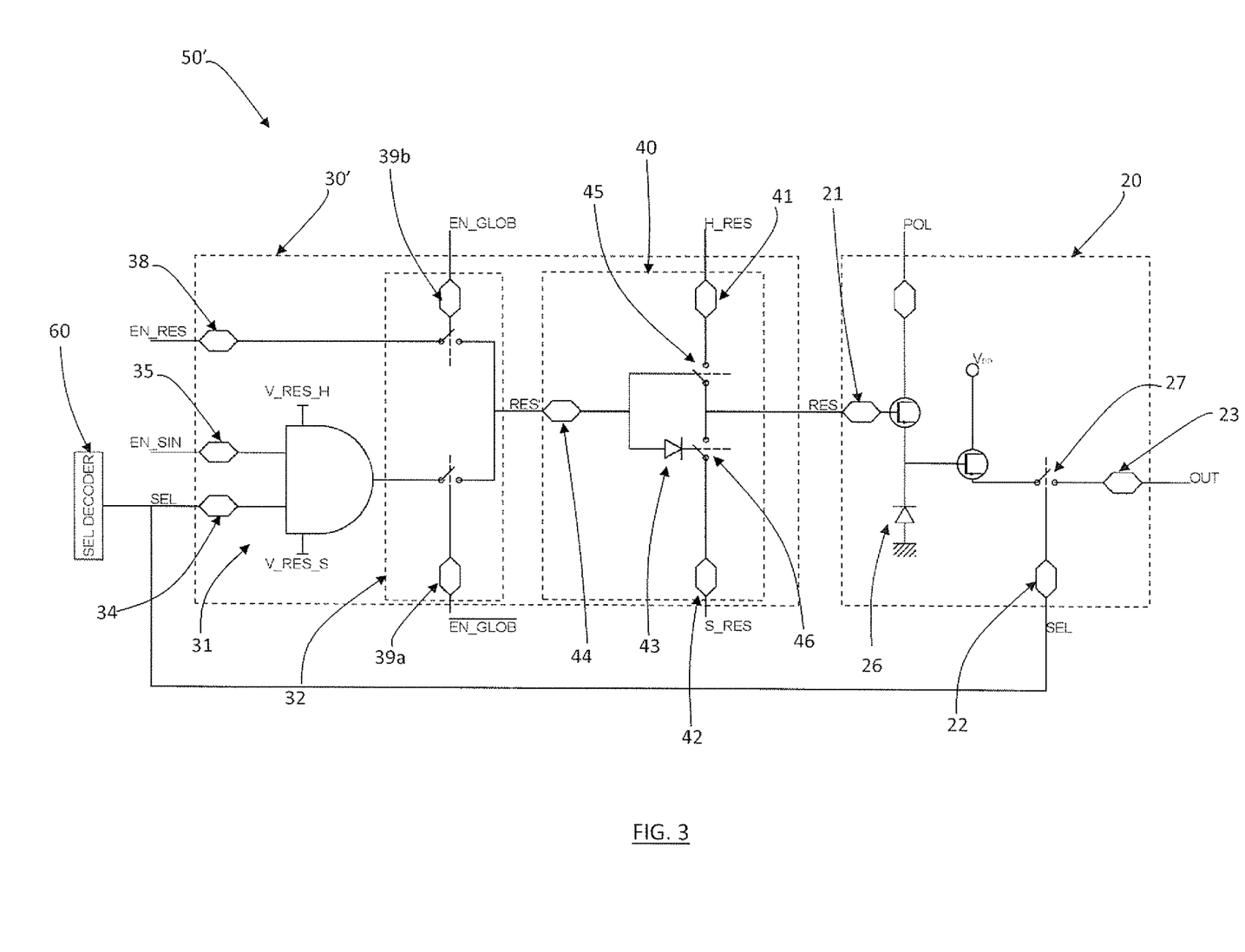
FIG. 3 shows an electrical diagram of a third embodiment of a sub-block of an image sensor in a device according to the present invention.

In an alternative embodiment, shown in FIG. 3, a charge control circuit 30 further comprises an auxiliary charge control circuit, 40, which interposes between the output of the interruption organs 32 and the reset terminal 21. The auxiliary circuit 40 provides a hard reset terminal, 41, arranged to receive a first external reference signal advantageously suitable to set to zero the content of the pixel 20, and a soft reset terminal 42, suitable for receiving a second external reference signal advantageously suitable for conditioning the discharge of the pixel 20. Through an auxiliary reset terminal 44, the output signal from the interruption organs 32 drives a hard reset switch, 45, and a soft reset switch, 46, to determine which of the two external reference signals is sent to the reset terminal 21 of the pixel 20.

In the embodiment described above, the circuit suitable for realizing a logic port of the AND type 31 is of the purely digital type and also the signal sent to the global reset terminal 38 is also purely digital. Despite this, the presence of the auxiliary circuit 40 allows anti-blooming and high signal dynamics functionalities. In fact, the second external reference signal sent to the soft reset terminal 42 is a dynamically programmed signal according to the response of the pixel 20 to be obtained and to the light dynamics to be represented within the same image. The second reference signal is advantageously selected from one of the signals shown in FIG. 5, that is to say a constant signal (FIG. 5a), to obtain a standard linear dynamic, a ramp (FIG. 5b), of the steps (FIG. 5c), a broken (FIG. 5d) may be composed of reset bursts (FIG. 5e), or may have other stills.

Figure 3B:
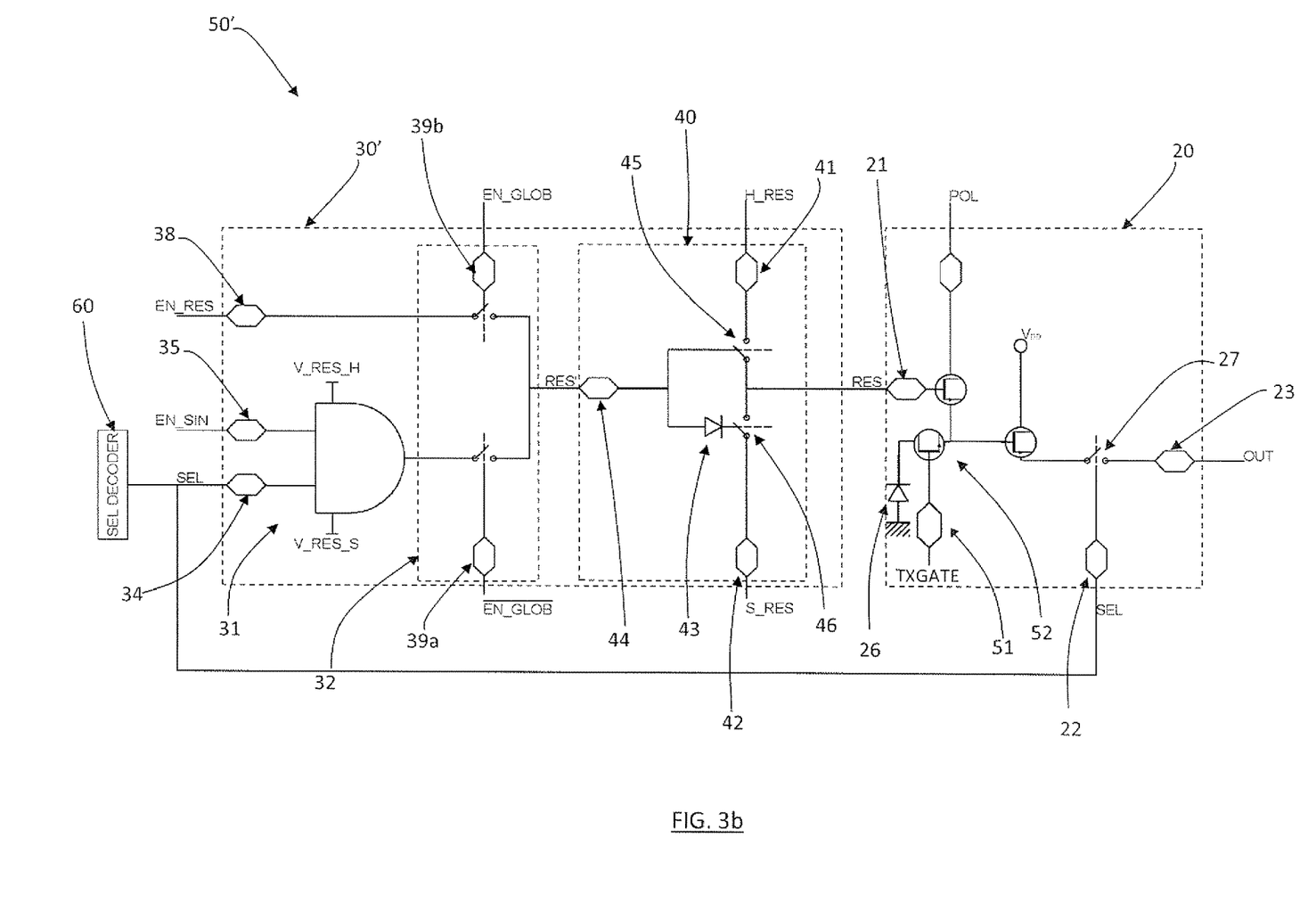
FIG. 3b shows an electrical diagram of a fourth embodiment of a sub-block of an image sensor in a device according to the present invention.

Even in the case in which the charge control circuit 30' comprises auxiliary charge control circuit 40 it is possible to adopt the variant, shown in FIG. 3b, in which the fourth transistor 52 added to the pixel 20 is present. Analogously to the example of FIG. 2b, the fourth transistor 52 is controlled by the analog signal TXGATE applied to the terminal 51 which can be both static and dynamic, so that, depending on the analog voltage applied to the terminal 51, the sensitivity of the pixel and its dynamics changes.

Figure 4A:
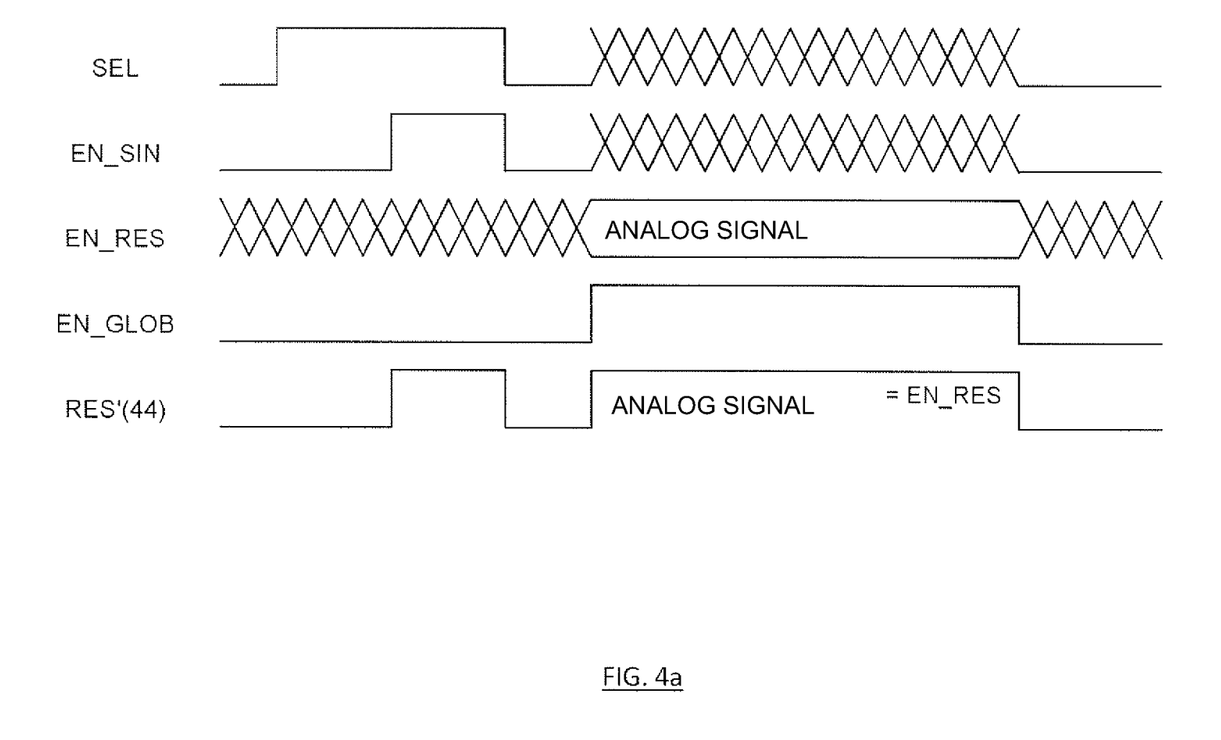
Figure 4B:
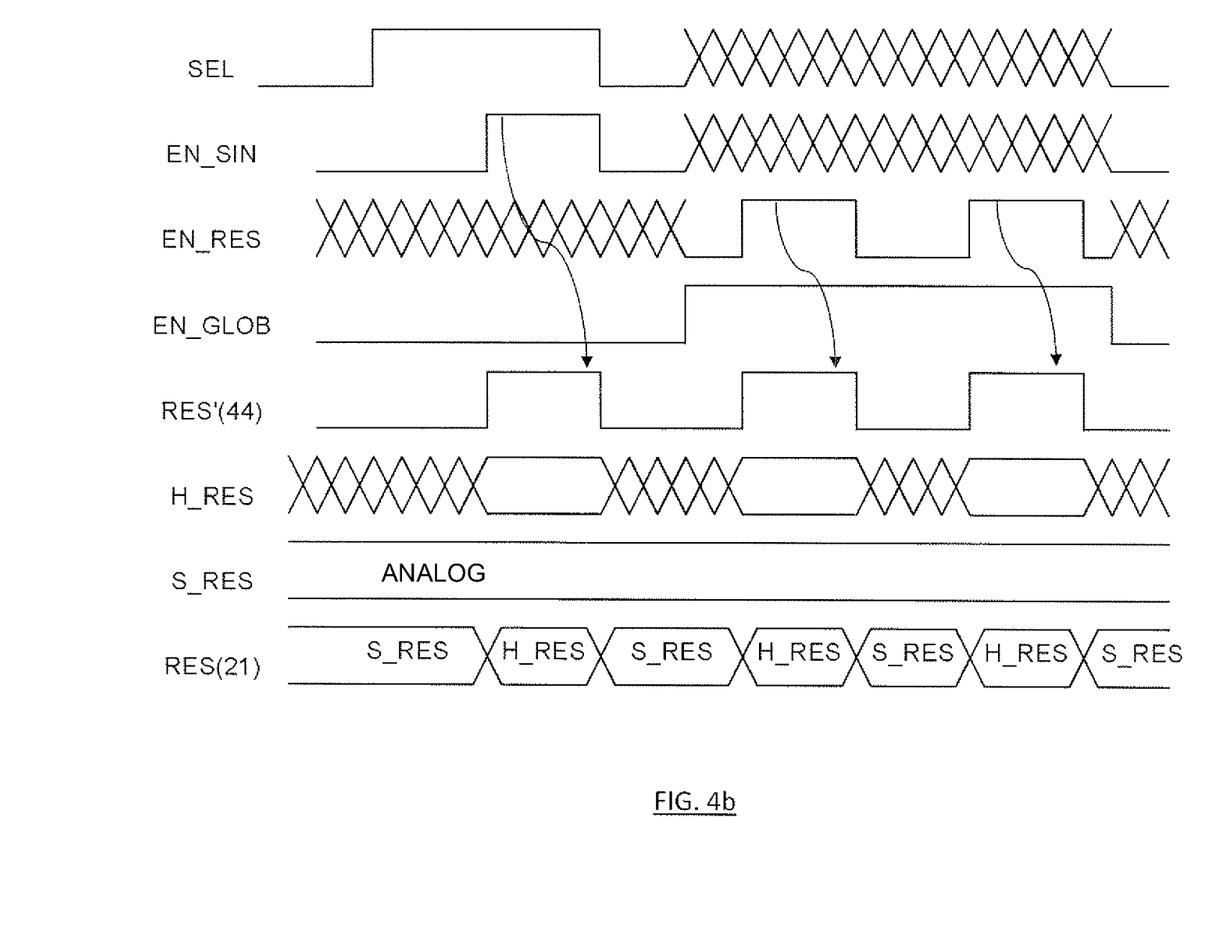

FIGS. 4a and 4b schematically illustrate the timing diagrams for transmitting the various control signals of the reset operation to the charge control circuits 30, 30', according to the present invention and the resulting reset signal, relating to the embodiments of FIG. 2 and of FIG. 3, respectively.

With reference to the charge control circuit 30 of FIG. 2, FIG. 4a shows: in the first row of the diagram starting from the top a line selection signal transmitted by the selection decoder circuit 60 to a selector terminal 34 of the charge control circuit 30 of a given sub-block of the image sensor 50, i.e., in the shown embodiment, of a row; in the second row the enabling signal (common to the whole array) transmitted to the enabling input terminal 35 of the sub-block of an image sensor 50; in the third line the global reset signal (common to the whole array) transmitted to the global reset terminal 38; in the fourth row, the control signal sent to the first control terminal 39a and to the second control terminal 39b in the form of its denied complementary; in the fifth row the reset signal that consequently arrives at the reset terminal 21.

In the left part of the diagram, the control signal 39 transmitted to the interruption organs 32 is such as to keep the first interruption element 36 closed and at the same time keep the second interruption element 37 open so that it is transmitted the output signal from the circuit suitable for realizing a logic port of the AND type 31. At a certain moment the selection decoder circuit 60 sends a selection signal to the sub-block of an image sensor 50. In a first step, only the selection signal is active at the input terminals of the AND logic port 31 and, therefore, no reset occurs while selection of the pixel 20 from the reading terminal 23 takes place because the switch 27 is closed, driven by the selection terminal 22, which enables the transmission of the output signal to the reading terminal 23. At the end of reading the pixel 20, the enabling signal transmitted to the enabling input terminal 35 is activated so that it takes place the transmission of the reset signal to the output terminal from the AND logic circuit 31 and then to the reset terminal 21.

In the right part of the diagram the control signal transmitted to the interruption organs 32 is such as to keep the first interruption element 36 open and at the same time keep the second interruption element 37 closed so that it is transmitted to the reset terminal 21 the global reset signal EN_RES transmitted to the global reset terminal 38, which is advantageously an analog signal.

With reference to the charge control circuit 30' of FIG. 3, FIG. 4b shows: in the first row of the diagram starting from the top a line selection signal, SEL, transmitted by the selection decoder circuit 60 to a selector terminal 34 of the charge control circuit 30' of a given sub-block of the image sensor 50', i.e., in the shown embodiment, of a row; in the second row the enabling signal (common to the whole array) transmitted to the enabling input terminal 35 of the sub-block of the image sensor 50'; in the third line the global reset signal (common to the whole array) transmitted to the global reset terminal 38; in the fourth row, the control signal sent to the first control terminal 39a and to the second control terminal 39b in the form of its denied complementary; in the fifth row the reset signal RES' output from the interruption organs 32; in the sixth row the first external reference signal H-RES transmitted to the hard/reset terminal 41; in the seventh row the second external reference signal S-RES transmitted to the soft reset terminal 42; in the eighth row the reset signal that consequently arrives at the reset terminal 21.

In the left part of the diagram the control signal transmitted to the interruption organs 32 is such as to keep the first interruption element 36 closed and at the same time keep the second interruption element 37 open so that the output signal from the circuit suitable for realizing a logic port of the AND type is transmitted. At a certain moment the selection decoder circuit 60 sends a selection signal to the sub-block of the image sensor 50'. In a first step, only the selection signal is active at the input terminals of the AND logic port 31 and the auxiliary circuit 40 is driven to transmit the second external reference signal S_RES, of the analog type, which then arrives at the reset terminal 21; in the meantime, the selection of the pixel 20 from the reading terminal 23 occurs because the switch 27 is closed, driven by the selection terminal 22, which enables the transmission of the output signal to the reading terminal 23. At the end of the reading of the pixel 20, the enabling signal transmitted to the enabling input terminal 35 is activated so that the reset signal is transmitted to the output terminal from the AND logic circuit 31 and therefore the auxiliary circuit 40 is driven to transmit to the reset terminal 21 the first external reference signal H_RES. In the left part of the diagram, the first external reference signal H_RES is transmitted exclusively to the pixels 20 of the sub-block of an image sensor 50' because driven by the selection signal SEL.

In the right part of the diagram the control signal transmitted to the interruption organs 32 is such as to keep the first interruption element 36 open and at the same time to keep the second interruption element 37 closed so that it is transmitted to the terminal 44 of the auxiliary circuit 40 the global reset signal EN_RES transmitted to the global reset terminal 38, which is in this case a purely digital signal. When the global reset signal EN_RES is active, the auxiliary circuit 40 is driven to transmit to the reset terminal 21 the first external reference signal H_RES, while when it is not active it is driven to transmit the second external reference signal S_RES. In this right part of the diagram, the first external reference signal H_RES is a global reset signal of the whole pixel array of the device 10 because it is not driven by the selection signal SEL but by the global reset signal EN_RES.

As it is clear from the above description, an image acquisition device according to the invention has several advantages over the most common prior art devices. First of all, like some other devices of the prior art, it eliminates the presence of a reset decoder circuit dedicated to the generation of line reset signals, with obvious savings in space and circuit costs. Moreover, with respect to the known prior art, it has obvious advantages in that the charge control circuits 30 can be both analog and purely digital, allowing to enable both global row and global reset extended to the entire pixel array, and allow finally to control the discharge of the internal photodiode to the various pixels of the various rows, for example, to avoid blooming and enable high dynamics. Moreover, the possibility of controlling the fourth transistor 52 with an analog signal allows, in combination with the charge control circuits 30, 30', to obtain a wide range of output signals with sensitivity and dynamics of light even very different, adapting the device to any need. Furthermore, the proposed and claimed circuit solution is extremely compact and simple to use. In fact, a decoder or other independent solution mechanism is removed and in its place there is a circuit cell consisting of a few transistors which is driven on the basis of the row selection signal and a few other signals that are managed in a global manner at a pixel array level.

The advantages highlighted above remain substantially unaltered even in the presence of further embodiments. For example, as will be easily understood, a sub-block of an image sensor 50 consisting of a charge control circuit 30 and a plurality of detection and conversion elements 20 associated therewith could comprise not all detection and conversion elements 20 of a row but any sub-block of pixels 20 of the whole device 10 and the device 10 could comprise a plurality of sub-blocks of an image sensor 50 which are not identical to each other but composed by a different number of pixels 20.

The advantages outlined above of the device of the invention obviously remain safeguarded also in the presence of further variations and modifications that a technician of the field can make without the need for any inventive contribution, remaining within the scope of protection defined by the claims that they follow.

The invention claimed is:

1. A digital device for image acquisition, comprising:
   at least one selection decoder circuit; and
   a plurality of sub-blocks of an image sensor, each comprising:
      a charge control circuit;
      one or more detection and conversion elements each having at least one photosensor and a discharge element of the photosensor which can be controlled, through a related reset terminal, by the charge control circuit and wherein each of the detection and conversion elements is capable of converting current generated by the photosensor into a voltage signal available at a reading terminal when enabling a selector switch controlled by a selection terminal through a selection signal of the selection decoder circuit;
   wherein the charge control circuit comprises:
      a circuit suitable for realizing a logic port of an AND type having a selector input terminal receiving the selection signal from the selection decoder circuit and an enabling input terminal suitable to receive an enable signal common to all the detection and conversion elements of the device, the circuit being adapted to transmit a reset signal to the reset terminal; and interruption organs connected to the reset terminal for transmitting to the reset terminal a reset signal alternatively constituted by an output signal of the circuit suitable for carrying out a logic port of the AND type or by a global reset signal transmitted to a relative global reset terminal.

2. The device according to claim 1, wherein each of the sub-blocks of the image sensor comprises a plurality of the detection and conversion elements and the sub-blocks of the image sensor are aggregated to form an array of the detection and conversion elements, the enable signal transmitted to the enabling input terminal and global reset signal transmitted to the global reset terminal being voltage signals in cormnon to all the sub-blocks of the image sensor, the selection decoder circuit being a line selection decoder circuit.

3. The device according to claim 1, wherein the interruption organs comprise two interruption elements of which a first interruption element and a second interruption element are driven by respective control signals.

4. The device according to claim 3, wherein the control signals are age signals in common to all the sub-blocks of the image sensor.

5. The device according to claim 1, wherein the circuit suitable for carrying out a logic port of the AND type is an analog circuit having a minimum reference voltage value greater than zero.

6. The device according to claim 1, further comprising analog generating organs for generating the global reset signal transmitted to the global reset terminal.

7. The device according to claim 1, wherein the signal applied to the gl obal reset terminal is a signal suitable for one of:
  reset of all the detection and conversion elements at the same time;
  limiting the blooming by imposing a minimum voltage other than zero and able to allow a correct buffer transistors operation of the detection and conversion elements; and
  releasing the detection and conversion elements in a controlled manner by applying a programmed control signal, the programmed control signal being selected from a constant signal to obtain a standard linear dynamic, a ramp, some steps, a polygonal line plurality of reset bursts.

8. The device according to claim 1, further comprising an auxiliary charge control circuit interposed between the interruption organs and the reset terminal, the auxiliary charge control circuit being suitable for receiving a reset output signal from the interruption organs and transmitting, in function of that, to the reset terminal alternatively a first external reference signal or a second external reference signal.

9. The device according to claim 8, wherein the second external reference signal is an analog signal generated by the analog signal generating organs of the type suitable for allowing high dynamics.

10. The device according to claim 8, further comprising a third transistor associated with a pixel, the third transistor being driven by a static or dynamic analog signal via a terminal so that it is possible to control the sensitivity of the pixel.

* * * * *